(12) United States Patent
Kobayashi et al.

(10) Patent No.: US 9,530,960 B2
(45) Date of Patent: Dec. 27, 2016

(54) MEMORY DEVICE AND MANUFACTURING METHOD THEREFOR

(71) Applicant: Kabushiki Kaisha Toshiba, Minato-ku (JP)

(72) Inventors: Yusuke Kobayashi, Kuwana (JP); Kikuko Sugimae, Kuwana (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/637,680

(22) Filed: Mar. 4, 2015

(65) Prior Publication Data

US 2016/0111641 A1   Apr. 21, 2016

(30) Foreign Application Priority Data

Oct. 17, 2014 (JP) ................................. 2014-213210

(51) Int. Cl.
  *H01L 45/00* (2006.01)
  *H01L 27/24* (2006.01)

(52) U.S. Cl.
  CPC ....... *H01L 45/1253* (2013.01); *H01L 27/2463* (2013.01); *H01L 45/16* (2013.01)

(58) Field of Classification Search
  CPC ................... H01L 27/11582; H01L 27/11556; H01L 27/1157; H01L 29/7926; H01L 27/11578; H01L 27/0688; H01L 27/11551; H01L 21/8221; G11C 16/0483
  USPC ............. 438/268, 622; 257/314; 365/185.11, 365/185.17
  See application file for complete search history.

(56) References Cited

U.S. PATENT DOCUMENTS

| 8,120,116 B2 | 2/2012 | Takeuchi | |
| 2011/0019480 A1* | 1/2011 | Kito | ................. H01L 27/11565 365/185.18 |
| 2011/0287612 A1* | 11/2011 | Lee | ................... H01L 27/11578 438/478 |
| 2012/0300527 A1* | 11/2012 | Shim | ...................... G11C 5/147 365/51 |

FOREIGN PATENT DOCUMENTS

| JP | 2012-99837 | 5/2012 |
| JP | 2014-72297 | 4/2014 |

\* cited by examiner

*Primary Examiner* — David Vu
*Assistant Examiner* — Jonathan Han
(74) *Attorney, Agent, or Firm* — Oblon, McClelland, Maier & Neustadt, L.L.P.

(57) ABSTRACT

According to one embodiment, a memory device includes a substrate, a conductive wire provided above the substrate to extend in a first direction and including an end portion decreases in width toward a distal end, and a contact connected to the conductive wire at least a side surface of the end portion. The end portion includes, in the contact, a first portion having a shortest distance from an outer peripheral surface of the contact and a second portion extending from the first portion and having a distance from the outer peripheral surface of the contact longer than the shortest distance.

19 Claims, 14 Drawing Sheets

FIG. 12A
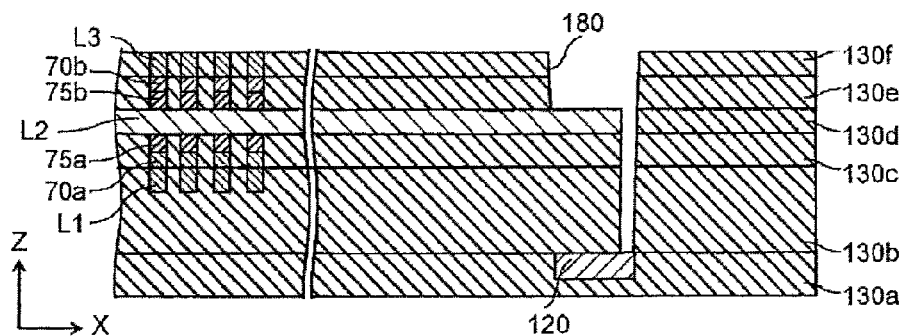
FIG. 12B
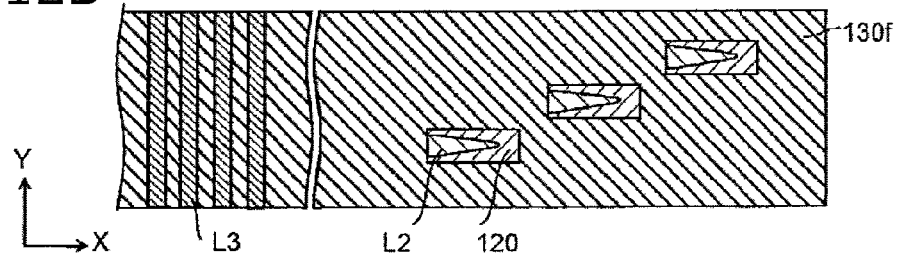
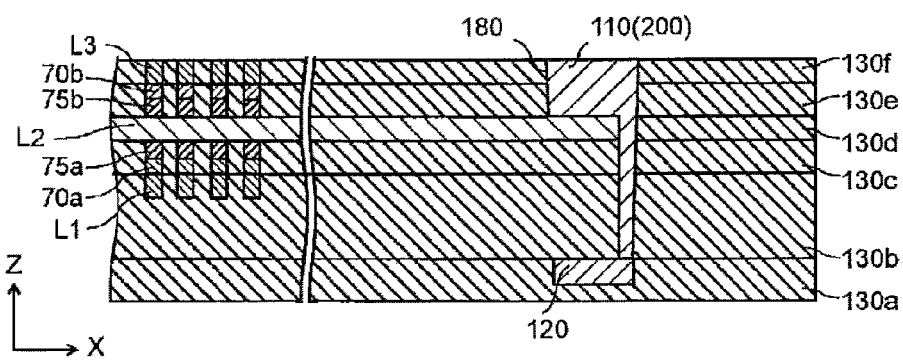
FIG. 13

MEMORY DEVICE AND MANUFACTURING METHOD THEREFOR

CROSS-REFERENCE TO RELATED APPLICATIONS

This application is based upon and claims the benefit of priority from Japanese Patent Application No. 2014-213210, filed on Oct. 17, 2014; the entire contents of which are incorporated herein by reference.

FIELD

Embodiments described herein relate generally to a memory device and a method for manufacturing the same.

BACKGROUND

In recent years, high integration of semiconductor memory devices has been in progress. As one method of the high integration, a three-dimensional memory device has been developed. A cross-point memory of a three-dimensional stacked type has been proposed as a candidate of the three-dimensional memory device.

In the cross-point memory, it is difficult to form lead-out sections of word lines and bit lines and form contacts without increasing the area of the lead-out sections.

BRIEF DESCRIPTION OF THE DRAWINGS

FIGS. 12A and 12B are a schematic plan view and a cross-sectional view showing one process of the manufacturing method of the memory device according to the first embodiment;

FIG. 13 is a schematic cross-sectional view showing one process of the manufacturing method of the memory device according to the first embodiment;

DETAILED DESCRIPTION

In general, according to one embodiment, a memory device includes a substrate, a conductive wire provided above the substrate to extend in a first direction and including an end portion decreases in width toward a distal end, and a contact connected to the conductive wire at least a side surface of the end portion. The end portion includes, in the contact, a first portion having a shortest distance from an outer peripheral surface of the contact and a second portion extending from the first portion and having a distance from the outer peripheral surface of the contact longer than the shortest distance.

Embodiments of the invention are described below with reference to the drawings.

Note that, in the following description, for convenience, a side close to a substrate side is represented as a lower side. Scales of the figures are not always accurate for want of space.

First Embodiment

A basic configuration of a memory cell array 10 of a memory device according to a first embodiment is described with reference to FIG. 1. Note that, in the specification, for convenience of description, an XYZ rectangular coordinate system is adopted. Two directions parallel to an upper surface 55a of a substrate (e.g., a silicon substrate) 55 and crossing each other are represented as an "X-direction" and a "Y-direction". A direction perpendicular to the upper surface 55a is represented as a "Z-direction".

A circuit element such as a MOS transistor and an insulating film are formed on the substrate 55. In a part of a region above the substrate 55, a memory cell array 10 is disposed as shown in FIG. 1.

Figure 1:
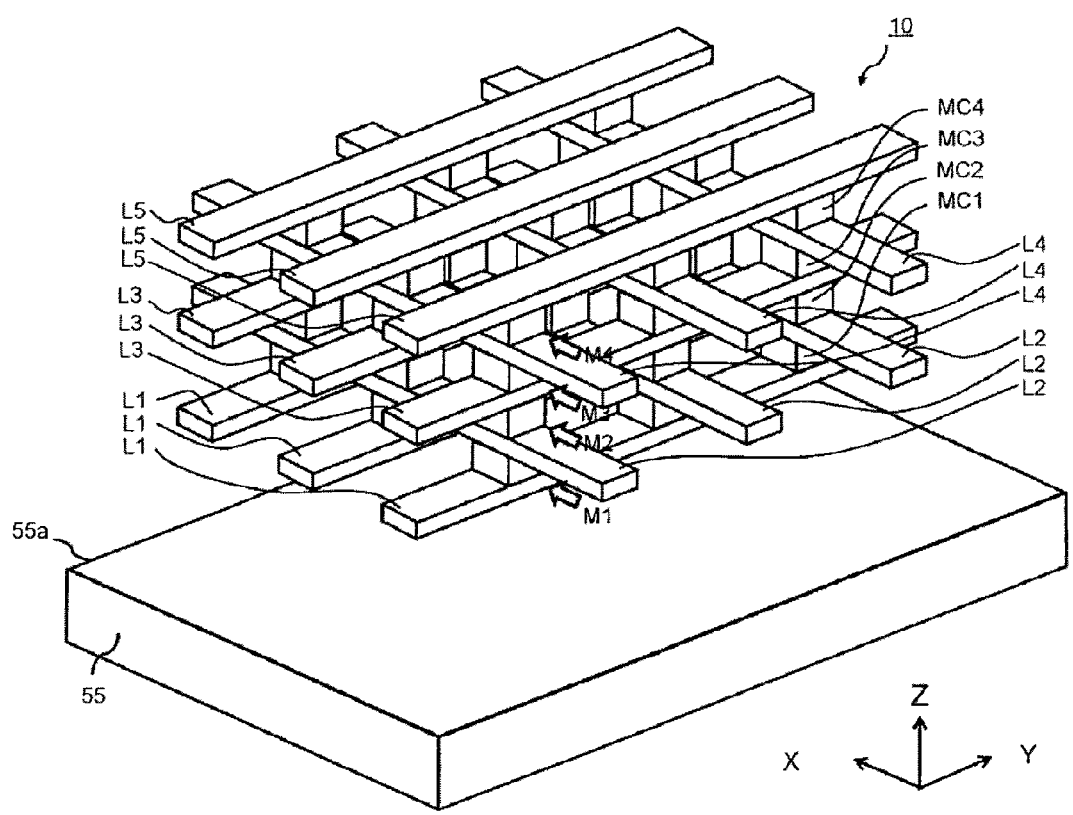
FIG. 1 is a diagrammatic perspective view showing the schematic configuration of a memory cell array of a memory device according to a first embodiment.

FIG. 1 shows an example in which the memory cell array 10 includes four memory cell array layers M1, M2, M3, and M4 stacked in the Z-direction.

On the substrate 55, conductive wires L1, L2, L3, L4, and L5 are disposed in order from the substrate 55 side. In the following description, the conductive wires L1, L2, L3, L4, and L5 are simply referred to as conductive wires L when it is not particularly necessary to distinguish the conductive wires.

Odd-numbered conductive wires from the substrate 55 side, that is, the conductive wires L1, L3, and L5 extend in the Y-direction. Even-numbered conductive wires from the substrate 55 side, that is, the conductive wires L2 and L4 extend in the X-direction.

The conductive wires function as word lines and bit lines.

The memory cell array layer M1 is formed between the conductive wires L1 and the conductive wires L2. The memory cell array layer M2 is formed between the conductive wires L2 and the conductive wires L3. The memory cell array layer M3 is formed between the conductive wires L3 and the conductive wires L4. The memory cell array layer M4 is formed between the conductive wires L4 and the conductive wires L5. In the following description, the memory cell array layers M1, M2, M3, and M4 are simply referred to as memory cell array layers M when it is unnecessary to distinguish the memory cell array layers.

The memory cell array layer M1 includes a plurality of memory cells MC1 disposed on an array in the X-direction and the Y-direction. Similarly, the memory cell array layer M2 includes a plurality of memory cells MC2 disposed on an array. The memory cell array layer M3 includes a plurality of memory cells M3 disposed on an array. The memory cell array layer M4 includes a plurality of memory cells MC4 disposed on an array. In the following description, the memory cells MC1, MC2, MC3, and MC4 are simply referred to as memory cells MC when it is unnecessary to distinguish the memory cells.

Figure 2:
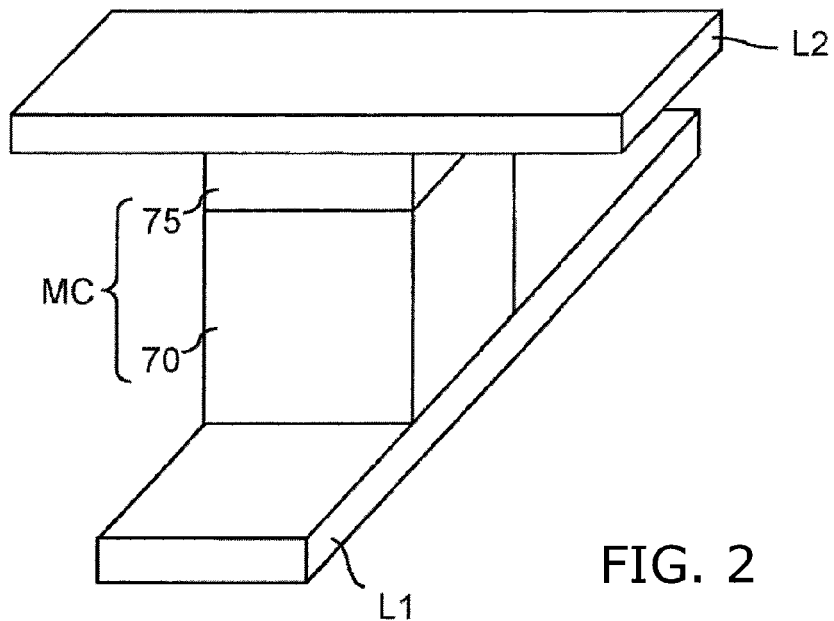
FIG. 2 is a diagrammatic perspective view showing the schematic configuration of a memory cell of the memory device according to the first embodiment.

The basic configuration of the memory cell MC is described with reference to FIG. 2. Note that, in FIG. 2, as an example of the memory cell MC, the memory cell MC1 formed between the conductive wire L1 and the conductive wire L2 is illustrated.

The memory cell MC includes a device selection film 70 and a variable resistance film 75 provided on the device selection film 70. The device selection film 70 is a film that controls whether to feed an electric current to the memory cell MC. The device selection film 70 is, for example, a silicon diode. For example, metal oxide is used in the variable resistance film 75. When a voltage is applied to the variable resistance film 75, a filament is formed on the inside of the variable resistance film 75 and an electric resistance value decreases. When a voltage is applied again, the filament retracts and the electric resistance value increases. That is, when a low resistance state of the electric resistance value of the variable resistance film 75 is represented as "0" and a high resistance state of the electric resistance value is represented as "1", for example, binary data can be stored in the memory cell MC. Naturally, the low resistance state may be represented as "1" and the high resistance state may be represented as "0".

A conductive wire lead-out region (An interconnection region) Rp is described with reference to FIGS. 3A and 3B. First, a region where word lines and bit lines cross is referred to as memory cell region Rm. In the memory cell region Rm, not-shown memory cells are formed.

The conductive wire lead-out region Rp is a region where contacts 200 described below are disposed. That is, the memory cell region Rm is connected to peripheral circuits such as a decoder and a sense amplifier via the conductive wire lead-out region Rp. The conductive wire lead-out region Rp is provided in a region deviating from the memory cell region Rm to one side in the X-direction.

As an example, the conductive wire lead-out region Rp of the conductive wires L2 is described.

Figure 3A:
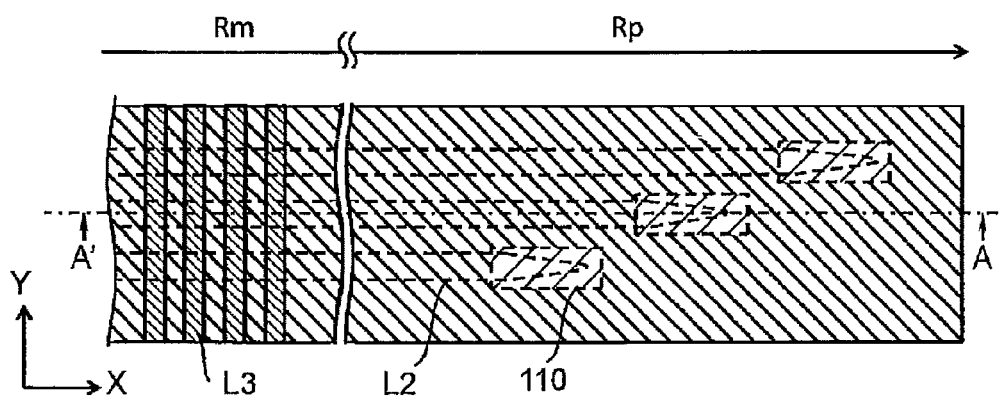
FIGS. 3A and 3B are a schematic plan view and a cross-sectional view illustrating a memory cell array of the memory device according to the first embodiment.
Figure 3B:
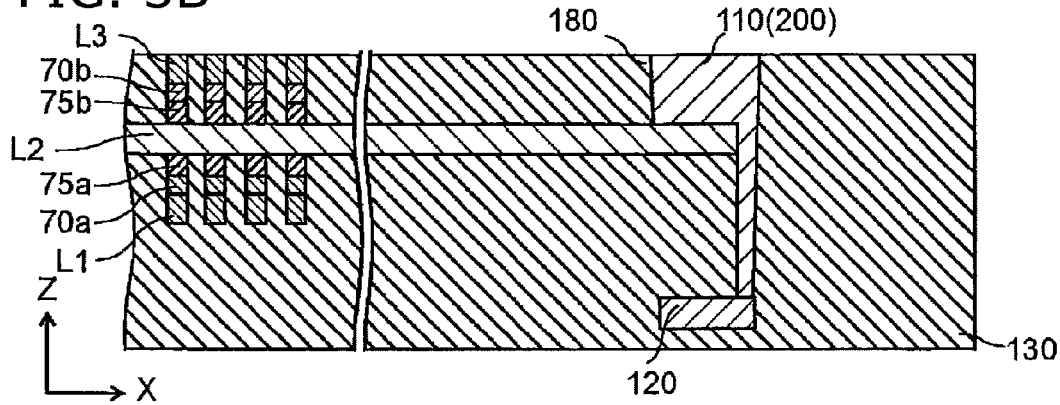

FIG. 3A is a plan view of the memory cell region Rm and the conductive wire lead-out region Rp on the upper surfaces of the conductive wires L3. An interlayer insulating film 130 and structures under contact members 110 are indicated by broken lines. FIG. 3B is a schematic sectional view taken along line A-A' shown in FIG. 3A.

The conductive wires L2 extend from the memory cell region Rm to the conductive wire lead-out region Rp. The width in the Y-direction of end portions of the conductive wires L2 decreases toward the distal ends of the end portions. The end portion of the conductive wires L2 has needle-like form, for example. The needle-like form has an acute angle. The contacts 200 are disposed at the end portions of the conductive wires L2. The contacts 200 include the contact members 110 in contact holes 180. The contact holes 180 have a longitudinal part in the X-direction, which is an extending direction of the conductive wires L2 and have a latitudinal part in the Y-direction. The contact members 110 are formed to cover the end portions of the conductive wires L2 from above the conductive wires L2 and are in contact with lower layer interconnects 120. Therefore, the conductive wires L2 are electrically connected to the lower layer interconnects 120 through the contacts 200, that is, the contact members 110.

A connecting portion of the contact 200 and the conductive wire L2 is described in detail with reference to FIGS. 4 and 5.

Figure 4:
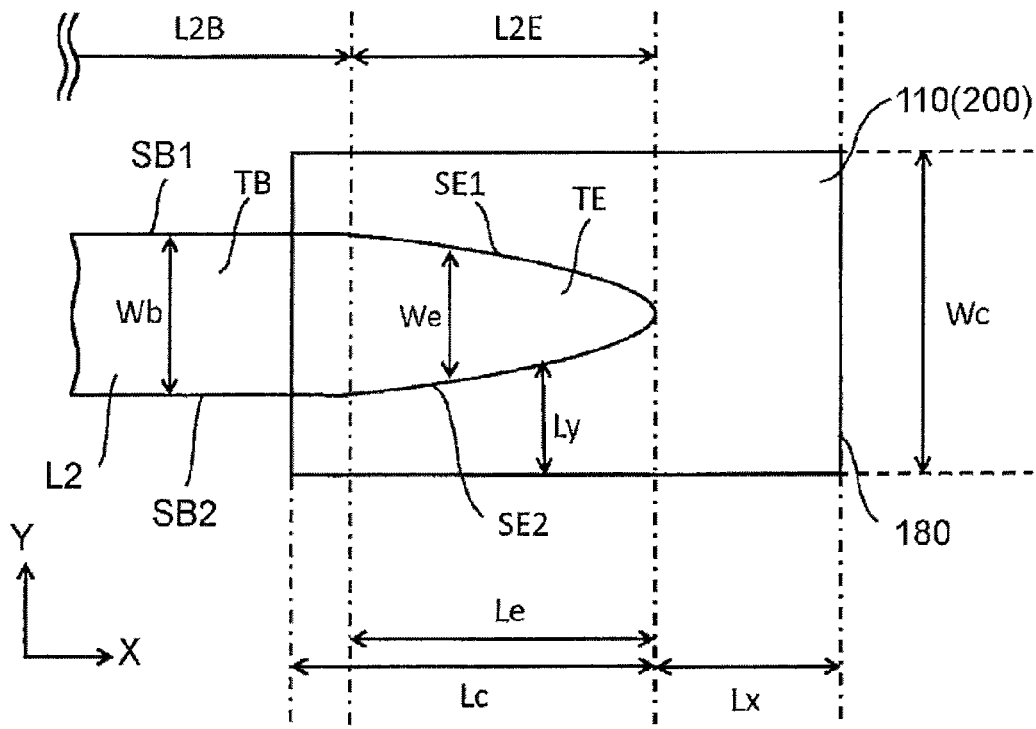
FIG. 4 is a schematic plan view illustrating an end portion of a conductive wire of the memory device according to the first embodiment.

FIG. 4 is a plan view showing the conductive wire L2 and the contact hole 180 and equivalent to the upper surface of the conductive wire L2. The contact member 110 in the contact hole 180 is shown transparent for convenience. A boundary line of the contact member 110 is shown. The upper surface of the conductive wire L2 is shown without hatching. FIG. 5 is a perspective view showing the conductive wire L2, the contact hole 180, and an upper surface 120a of the lower layer interconnect 120. In FIG. 1, the contact member 110 is shown transparent for convenience. A boundary line of the contact member 110 is shown. The conductive wire L2 is shown without hatching. Note that scales are not always accurate for want of space.

Details are described below.

First, the conductive wire L2 is described. As shown in FIG. 4, in the conductive wire L2, a region where the length (the width) in the Y-direction decreases at the end portion is represented as a region L2E. A region where the length (the width) in the Y-direction is substantially the same is represented as a region L2B. Note that, naturally, since the shape of the conductive wire L2 fluctuates because of processing or the like, the width is not completely fixed. Slight fluctuation in the width is allowed.

The length (the width) in the Y-direction of the region L2B is represented as width Wb. The region L2B includes an upper surface TB and side surfaces SB1 and SB2. Note that the side surfaces SB1 and SB2 are simply referred to as side surfaces SB when it is unnecessary to distinguish the side surfaces.

The length in the Y-direction of the region L2E is represented as width We and the length in the X-direction of the region L2E is represented as length Le. Note that the width We decreases toward the end portion. The region L2E includes an upper surface TE and side surfaces SE1 and SE2. Note that the side surfaces SE1 and SE2 are simply referred to as side surfaces SE when it is unnecessary to distinguish the side surfaces.

Note that the side surface SB1 and the side surface SE1 are side surfaces on a positive side in the Y-direction and the side surface SB2 and the side surface SE2 are side surfaces on a negative side in the Y-direction. In other words, when viewed from the upper surface, the side surfaces SB1 and SE1 are on the left in the extending direction of the conductive wire L2 and the side surfaces SB2 and SE2 are on the right side of the extending direction.

Each of the side surfaces SE includes one or a plurality of curved surfaces or one or a plurality of planes or both of the curved surface(s) and the plane(s).

The contact 200 is described with reference to FIGS. 3A and 3B and FIG. 4.

In the interlayer insulating film 130, the contact hole 180 is formed to cover the end portion of the conductive wire L2, for example, the region L2E and the region L2B. The contact hole 180 is also formed in a part on the region L2B in addition to the region L2E. The contact member 110 is embedded in the contact hole 180.

In other words, the contact member 110 is embedded in contact with parts of the region L2E and the region L2B. More specifically, the contact member 110 is provided in contact with the upper surface TE, the side surfaces SE, a part of the upper surface TB and parts of the side surfaces SB.

A region where the contact member 110 is embedded in the contact hole 180 is referred to as contact 200. The contact 200 electrically connects the conductive wire L2 and the lower layer interconnect 120 (not shown in the figure). The electric resistance of the conductive wire L2 and the contact 200 is desirably small. This is because the operation of the entire memory device is improved.

The length in the X-direction of the region where the conductive wire L2 and the contact 200 are in contact is represented as Lc. The width in the Y-direction of the contact 200 is represented as Wc. Note that, in the embodiment, a relation of Wb<Wc holds.

The distance in the X-direction between the conductive wire L2 and the contact hole 180 is represented as a distance Lx. The distance in the Y-direction of the conductive wire L2 and the contact hole 180 is represented as a distance Ly.

In order to reduce the electric resistance of the contact 200, it is necessary to embed the contact member 110 in the contact hole 180 with a sufficiently small gap and increase a contact area. Therefore, it is necessary to increase length Lc while securing sufficient length as the distance Ly.

Figure 5:
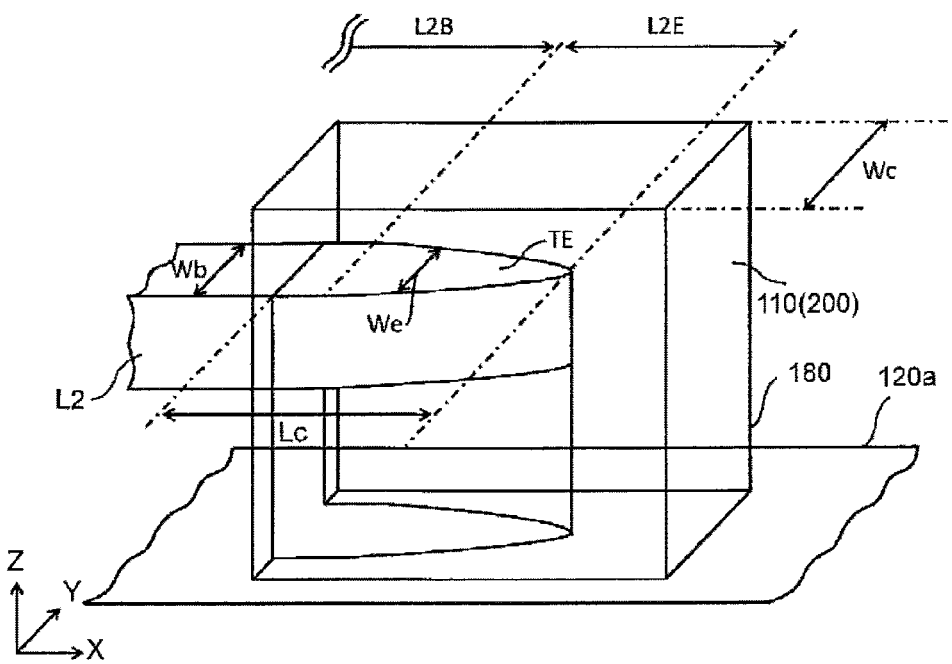
FIG. 5 is a schematic diagrammatic perspective view illustrating the end portion of the conductive wire of the memory device according to the first embodiment.

FIG. 5 is a perspective view of a region where the contact 200 is formed. As described above, the contact hole 180 is formed to cover the conductive wire L2 and is in contact with the upper surface 120a of the lower layer interconnect 120 below the conductive wire L2.

The contact member 110 is formed in the contact hole 180. That is, the contact member 110 conducts to the conductive wire L2 and conducts to the lower layer interconnect 120 below the conductive wire L2.

Note that, as shown in FIG. 5, except a slight wraparound, the contact member 110 is not formed in the contact hole 180 on the lower side of the conductive wire L2. The interlayer insulating film 130 is formed in a region below the conductive wire L2. This is because processing of the contact hole 180 is performed using the conductive wire L2 as a mask in a manufacturing method described below.

A manufacturing method for a memory device of the embodiment is described below with reference to FIGS. 6A to 13. FIGS. 6A to 13 are schematic sectional views taken along line A-A' in FIG. 3A unless specifically noted otherwise.

First, a peripheral circuit (not shown in the figure) is formed on a not-shown substrate 55.

Figure 6A:
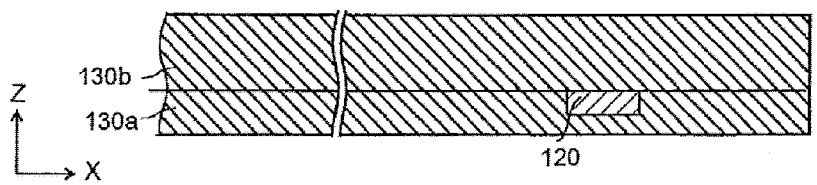
FIG. 6A to FIG. 6C are schematic cross-sectional views showing one process of a manufacturing method of the memory device according to the first embodiment.

Thereafter, as shown in FIG. 6A, for example, silicon oxide is deposited on the substrate 55 to form an interlayer insulating film 130a and form the lower layer interconnect 120. Subsequently, an interlayer insulating film 130b is formed on the interlayer insulating film 130a.

Figure 6B:
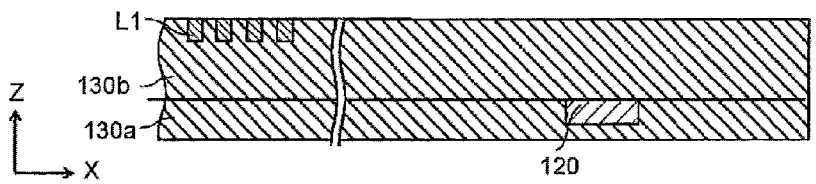

Thereafter, as shown in FIG. 6B, the conductive wires L1 are formed on the interlayer insulating film 130b using a damascene method. For example, trenches are formed in an upper layer portion of the interlayer insulating film 130b. Thereafter, after the material of the conductive wires L1 is formed, the material of the conductive wires L1 on the interlayer insulating film 130b is removed by CMP (Chemical Mechanical Polishing).

Note that the conductive wires L1 may be formed by, for example, an RIE (Reactive Ion Etching) method. In this case, first, the material of the conductive wires L1 is formed on the interlayer insulating film 130b. Thereafter, the conductive wires L1 is formed by mask pattern formation by a lithography method and selective etching by the RIE. Subsequently, an insulating material is deposited to embed the conductive wires L1 and planarized by the CMP.

Figure 6C:
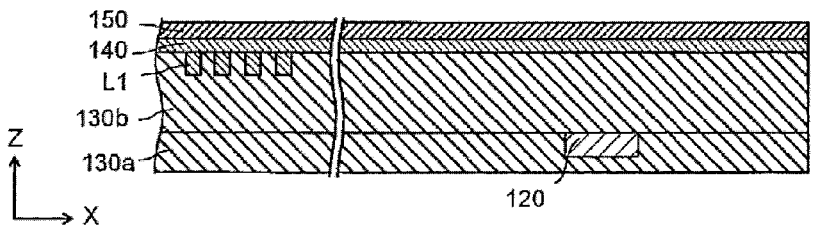

Thereafter, as shown in FIG. 6C, a silicon film 140 is formed over the entire surface of the interlayer insulating film 130b. A metal oxide film 150 is formed on the silicon film 140. The metal oxide film 150 is a variable resistance film. A memory device material film is formed of the silicon film 140 and the metal oxide film 150.

Figure 7A:
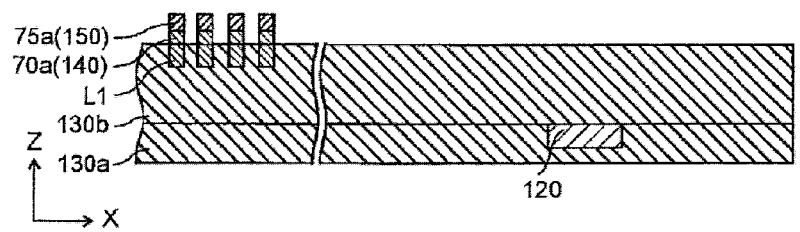
FIGS. 7A and 7B are schematic cross-sectional views showing one process of the manufacturing method of the memory device according to the first embodiment.

Thereafter, as shown in FIG. 7A, mask pattern formation by the lithography method and selective etching by the RIE is performed. Consequently, in the memory cell region Rm, the metal oxide film 150 and the silicon film 140 partially remaining above the conductive wires L1 change to variable resistance films 75a and device selection films 70a.

Thereafter, an interlayer insulating film 130c is formed on the interlayer insulating film 130b.

Figure 7B:
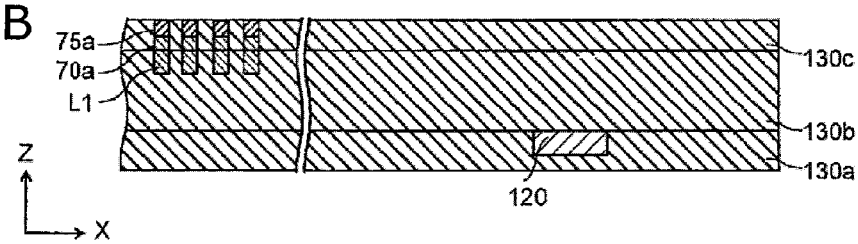

As shown in FIG. 7B, planarization by the CMP is applied to the upper surface of the interlayer insulating film 130c. The upper surfaces of the variable resistance films 75a are exposed on the upper surface of the interlayer insulating film 130c by the planarization.

Figure 8A:
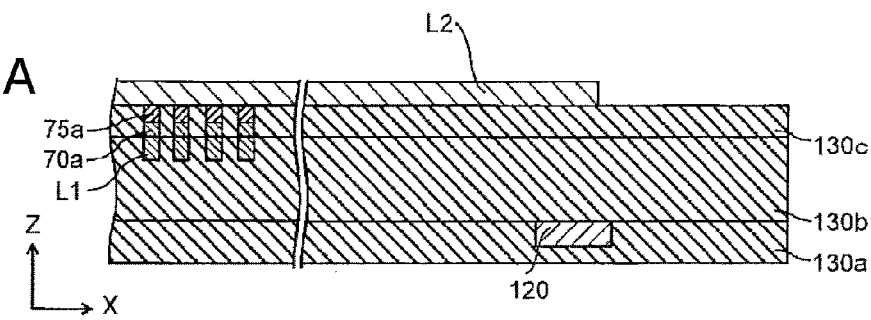
FIGS. 8A and 8B are a schematic plan view and a cross-sectional view showing one process of the manufacturing method of the memory device according to the first embodiment.
Figure 8B:
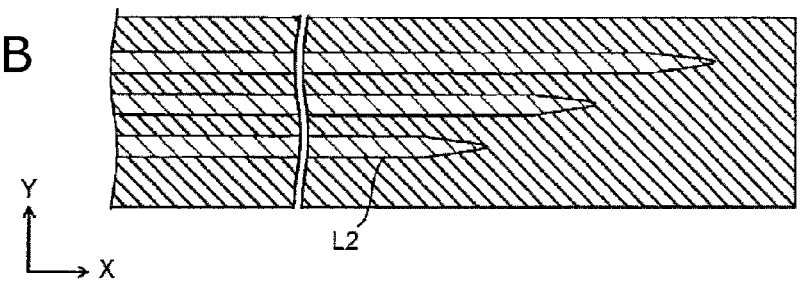

Thereafter, as shown in FIGS. 8A and 8B, a second conductive wire material is formed on the interlayer insulating film 130c. Mask pattern formation by the lithography method and etching by the RIE are performed to form the conductive wires L2. Note that FIG. 8B is a plan view of FIG. 8A.

Note that a mask pattern may be formed using a nanoimprint method instead of the mask pattern formed by the lithography method.

Thereafter, an interlayer insulating film 130d is formed to cover the conductive wires L2.

Figure 9A:
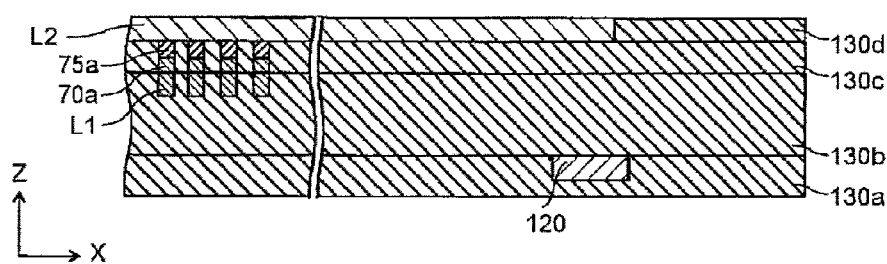
FIGS. 9A and 9B are schematic cross-sectional views showing one process of the manufacturing method of the memory device according to the first embodiment.

As shown in FIG. 9A, the interlayer insulating film 130d is planarized by the CMP. Note that the conductive wires L2 may be formed by the damascene method like the conductive wires L1.

Figure 9B:
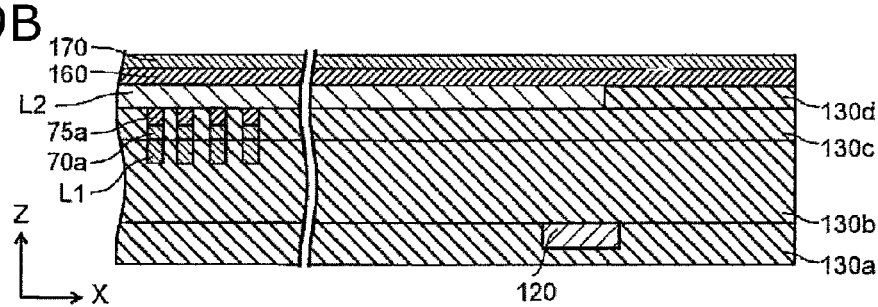

Thereafter, as shown in FIG. 9B, a metal oxide film 160 is formed and a silicon film 170 is formed. A variable resistance film is used as the metal oxide film 160. A memory device material film is formed of the silicon film 170 and the metal oxide film 160.

Figure 10A:
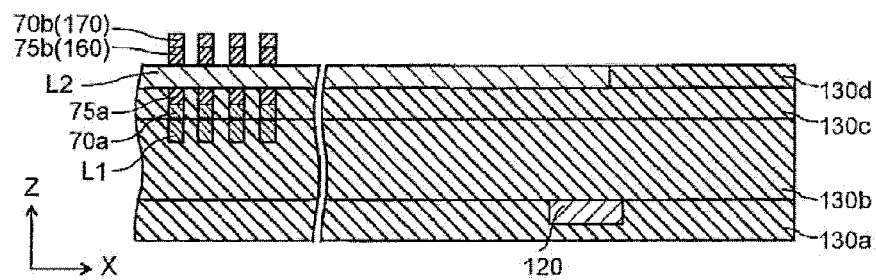
FIGS. 10A and 10B are schematic cross-sectional views showing one process of the manufacturing method of the memory device according to the first embodiment.

Thereafter, as shown in FIG. 10A, anisotropic etching such as the RIE method is performed to selectively remove the silicon film 170 and the metal oxide film 160. Consequently, in the memory cell region Rm, the metal oxide film 150 and the silicon film 140 partially remaining in regions right above the conductive wires L1 change to variable resistance films 75b and device selection films 70b.

Thereafter, an interlayer insulating film 130e is formed to cover the device selection films 70b, the conductive wires L2, and the interlayer insulating film 130d.

Figure 10B:
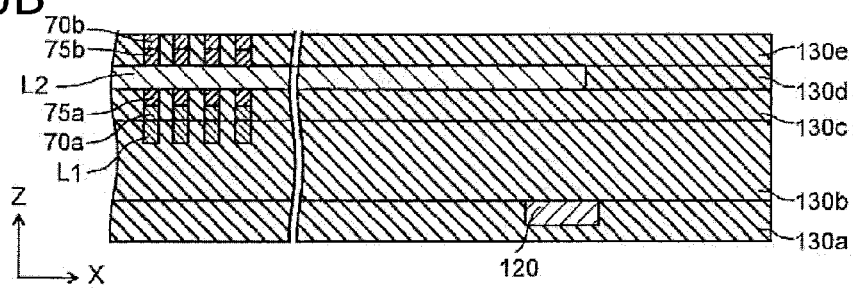

As shown in FIG. 10B, the upper surface of the interlayer insulating film 130e is planarized by the CMP.

Figure 11A:
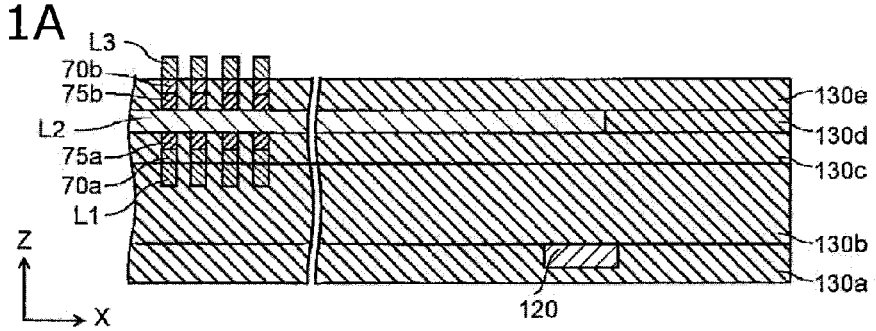
FIGS. 11A and 11B are schematic cross-sectional views showing one process of the manufacturing method of the memory device according to the first embodiment.

Thereafter, as shown in FIG. 11A, the material of the conductive wires L3 is formed on the interlayer insulating film 130e. The material is patterned to form the conductive wires L3. Note that the conductive wires L3 may be formed using the damascene method like the conductive wires L1.

Thereafter, an interlayer insulating film 130f is formed to cover the conductive wires L3.

Figure 11B:
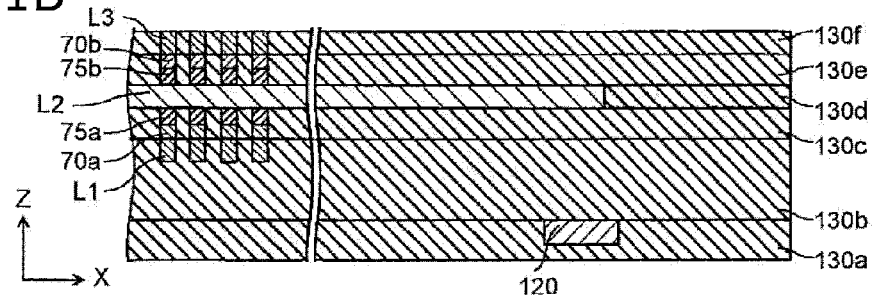

As shown in FIG. 11B, the interlayer insulating film 130f is planarized by the CMP method.

Thereafter, as shown in FIGS. 12A and 12B, on the interlayer insulating film 130f, mask pattern (not shown in the figures) formation by the lithography method and etching by the RIE are performed. The interlayer insulating films 130f, 130e, 130d, 130c, 130b, and 130a are selectively removed by anisotropic etching. The contact holes 180 are formed by the etching removal.

In the etching, a condition under which the conductive wires L2 are less easily etched is used. In the contact holes 180, the lower layer interconnects 120 and the conductive wires L2 are exposed. Note that FIG. 12B is a plan view of FIG. 12A.

Thereafter, as shown in FIG. 13, the contact members 110, which are conductive films, are formed. Planarization treatment is applied to the upper surface of the interlayer insulating film 130f by the CMP method or the like. Consequently, the contacts 200 are formed in which the contact members 110 are formed in the contact holes 180.

The other portions only have to be manufactured by a standard manufacturing method for a memory device. Consequently, the memory device of the embodiment is manufactured.

Effects of the embodiment is described.

In the embodiment, the conductive wire L2 includes, at the end portion, the region L2E where the width in the Y-direction decreases. For description, a comparative example in which, in the region L2E, the end portion does not decrease in width and is formed at fixed width Wb is described with reference to FIG. 14.

Figure 14:
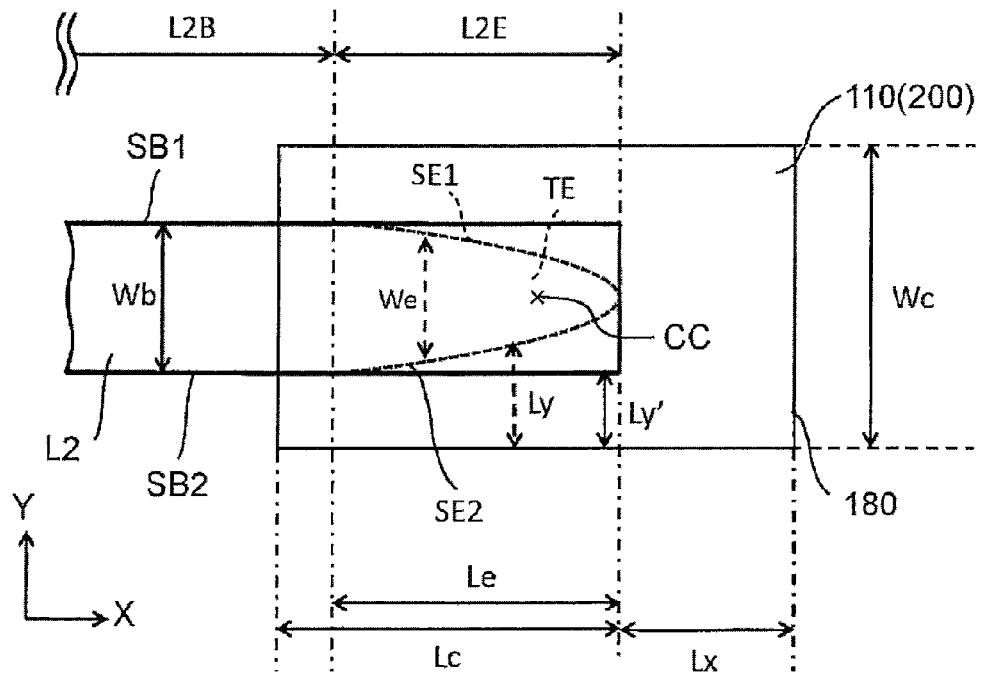
FIG. 14 is a schematic plan view showing an end portion of a conductive wire of the memory device according to the first embodiment and a comparative example.

FIG. 14 is a plan view equivalent to FIG. 4. The embodiment is indicated by a broke line and the comparative example is indicated by a solid line.

In the comparative example, compared with the embodiment, since the width in the Y-direction of the end portion is fixed, a contact area with the contact member 110 is larger than the contact area in the embodiment. However, as shown in FIG. 14, in a region equivalent to the region L2E at the end portion, a distance Ly' between the contact hole 180 and the conductive wire L2 is shorter than a distance Ly of the embodiment over the entire contact surface with the contact member 110.

Consequently, in the contact hole 180, in a side surface region of the conductive wire L2, an aspect ratio (a ratio of width and depth of a pattern to be embedded) increases. It is difficult to embed the contact member 110. Therefore, in the comparative example, even if the contact member 110 is embedded, an air gap occurs in the contact member 110 because of an embedding failure. It is difficult to reduce the resistance of the contact 200.

On the other hand, in the embodiment, as indicated by a broken line in FIG. 14, the conductive wire L2 includes the region L2E. Therefore, it is possible to set the distance Ly longer than the distance Ly' of the comparative example. That is, it is possible to reduce the aspect ratio. Therefore, it is possible to sufficiently embed the contact member 110 and reduce the resistance of the contact 200.

Note that, if the width We in the Y-direction of the contact hole 180 is increased, in the comparative example, it is possible to increase the distance Ly'. However, in this case, the distance between another conductive wire L2 located adjacent to the conductive wire L2 and the contact 200 decreases. A risk of short circuit increases. To avoid the risk of short circuit, it is necessary to increase the space between the conductive wire L2 and the other conductive wire L2 located adjacent to the conductive wire L2. However, since the area of the memory device increases, a storage capacity of the memory device per chip area decreases, leading to an increase in costs.

That is, since the conductive wire L2 includes the region L2E at the end portion, it is possible to reduce the resistance of the contact 200 without increasing the area of the memory device.

In other words, the conductive wire L2 includes the regions L2B and L2E at the end portion of the conductive wire L2. The distance Ly is the shortest in the region L2B and is longer than the smallest distance in the region L2E. Therefore, it is possible to reduce contact resistance of the conductive wire L2 and the contact 200.

In other words, the conductive wire L2 includes the end portion. The end portion includes a first portion having a shortest distance from an outer peripheral surface of the contact 200. The end portion includes a second portion extending from the first portion and having a distance from the outer peripheral surface of the contact 200 longer than the shortest distance.

Further, to obtain an effect of low resistance in the embodiment, it is necessary to sufficiently secure a region where the contact member 110 can be embedded. For this purpose, the length Lc is desirably at least twice or more as large as the width Wb. Further, the distance Le is desirably at least twice as large as the width Wb.

As shown in FIG. 14, the contact 200 is disposed to locate a center point CC of the contact 200 in a region where the conductive wire L2 is formed. By disposing the conductive wire L2 to overlap the center point CC of the contact 200, it is possible to sufficiently secure a contact area of the conductive wire L2 and the contact 200 and reduce the contact resistance of the conductive wire L2 and the contact 200.

Note that the center point CC means the contact point CC of the contact 200 on an XY plane including the conductive wire L2. For example, when the contact 200 has a substantially rectangular shape, the center point CC is the intersection of the diagonal lines. In other cases, the center point CC means, for example, the center of gravity point.

Note that the above description is focused on the distance Ly in the Y-direction. However, to sufficiently embed the contact member 110, it is desired to sufficiently secure the distance Lx in the X-direction as well. Specifically, the distance Lx is desirably larger than a maximum of the distance Ly. Alternatively, the distance Lx is desirably larger than the width Wb.

Further, in particular, when embedding in the X-direction is regarded as important, the distance Lx may be set longer than the distance Lc. The center point CC of the contact 200 and the conductive wire L2 do not have to overlap.

Modifications of the embodiment are described.

First, in the example described in the embodiment, the memory cell MC includes the device selection film 70 formed of the silicon diode and the variable resistance film 75 formed of the metal oxide. However, the memory cell MC is not limited to this. For example, the device election film 70 does not have to be provided. The variable resistance film 75 is not limited to the metal oxide film. For example, amorphous silicon may be used in the variable resistance film 75. An ion supply film containing, for example, silver may be provided on the variable resistance film 75. In this case, by applying a positive voltage for changing the ion supply film to a positive electrode and changing the variable resistance film 75 to a negative electrode, the silver contained in the ion supply film ionizes and moves in the variable resistance film 75, forms a filament in the variable resistance film 75, and reduces the electric resistance value of the variable resistance film 75. By applying a reverse voltage, the silver forming the filament in the variable resistance film 75 ionizes and moves toward the ion supply film. Consequently, the filament is cut and the electric resistance value of the variable resistance film 75 increases.

The embodiment is described using the conductive wire L2. However, not only this, but the embodiment can be applied to any conductive wire. Further, the embodiment may be simultaneously used for a plurality of conductive wires. The contact 200 can be formed in any period as long as the contact 200 is formed after the conductive wire L2 is formed. Several examples are described below as, for example, a second embodiment and a third embodiment.

As another modification, the conductive wire L2 may be connected to an upper layer interconnect (not shown in the figure) rather than the lower layer interconnect. The upper layer interconnect is an interconnect present above the conductive wire L2. Note that the conductive wire L2 may be connected to only the upper layer interconnect or may be connected to both of the upper layer interconnect and the lower layer interconnect.

As still another modification, the conductive wire L2 may include a film of an insulative mask material on the conductive wire L2. In this case, the contact 200 and the conductive wire L2 conduct on the side surfaces. The contact area decreases by the area of the upper surface. The contact resistance increases. However, it is possible to easily perform etching by performing processing of the contact hole 180 using a mask material as a mask instead.

Figure 15:
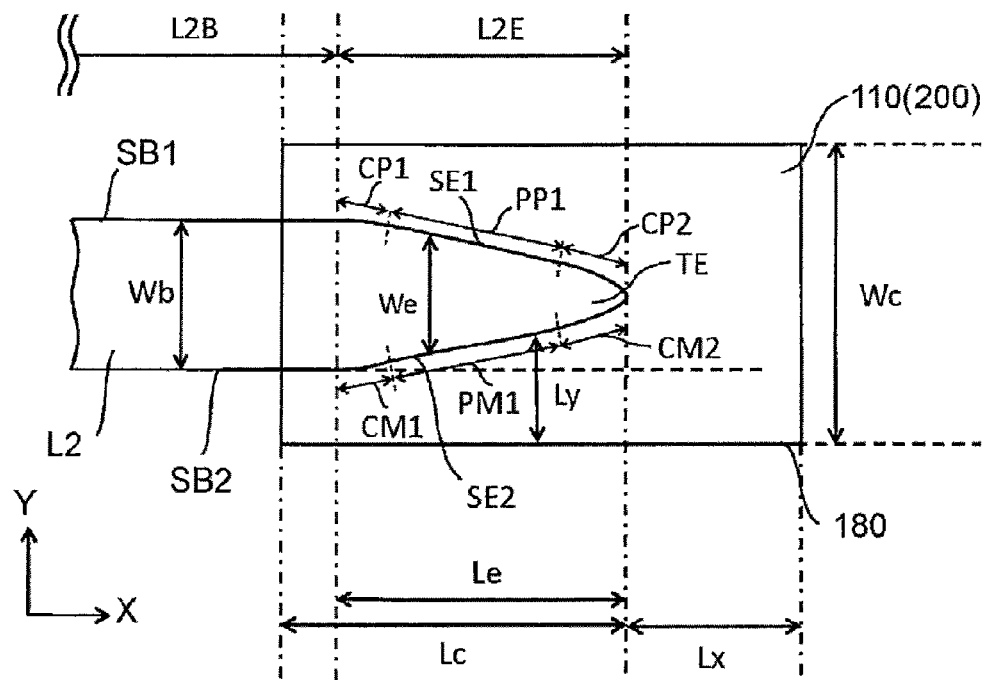
FIG. 15 is a schematic plan view illustrating an end portion of a conductive wire of a modification according to the first embodiment.

Further, still another modification is described with reference to FIG. 15. FIG. 15 is a plan view showing the conductive wire L2 and the contact member 110. The contact member 110 is shown transparent for convenience. A boundary line of the contact member 110 is shown. The conductive wire L2 is shown without hatching.

The side surface SE1 includes a plurality of surfaces such as a curved surface CP1, a surface PP1, and a curved surface CP2. The side surface SE2 includes a plurality of surfaces such as a curved surface CM1, a surface PM1, and a curved surface CM2.

The curvature of the curved surface CP2 is larger than the curvature of the curved surface CP1. The curvature of the curved surface CM2 is larger than the curvature of the curved surface CM1.

In the modification, the side surface SE1 and the side surface SE2 include the curved surface CP1 and the curved surface CM1 in a boundary between the side surface SB1 and the side surface SB2 and include the curved surface CP2 and the curved surface CM2 in a boundary between the side surface SE1 and the side surface SE2. When the side surface SE1 and the side surface SB1 include the curved surfaces in this way, it is easy to embed the contact member 110. Further, it is possible to prevent electric concentration in the contact 200 and improve reliability of the contact 200.

A plane may be used as the surface PP1 or the surface PM1.

As shown in FIG. 15, when the surface PP1 and the surface PM1 are planes, it is possible to increase the distance Ly compared with when the side surface SE1 or the side surface SE2 is formed of a convex curved surface convex with respect to the contact 200. That is, the contact member 110 is easily embedded.

Further, as the surface PP1 and the surface PM1, a plurality of concave curved surfaces concave with respect to the contact 200 may be used. In this case, the contact member 110 is more easily embedded.

Convex-concave surfaces can also be used as the surface PP1 and a surface PP2. In this case, it is possible to increase the contact area with the contact 200 and reduce the contact resistance with the contact 200.

Note that, in order to obtain the effect of facilitating the embedding, the length in the Y-direction of the surface PP1 and the surface PM1 is desirably larger than the length in the Y-direction of the curved surface CP1, the curved surface CP2, the curved surface CM1, and the curved surface CM2.

Second Embodiment

Figure 16A:
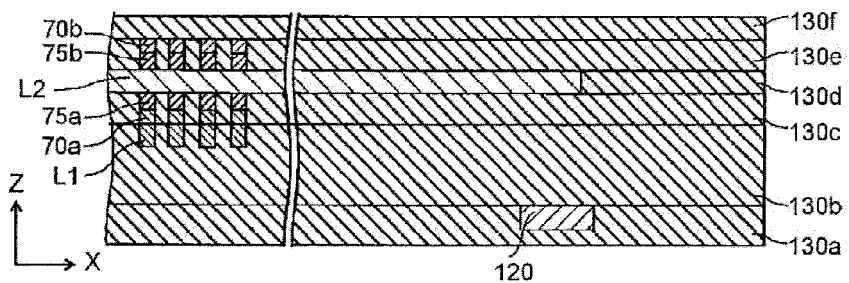
FIGS. 16A and 16B are schematic cross-sectional views showing a manufacturing method of a memory device according to the second embodiment.
Figure 16B:
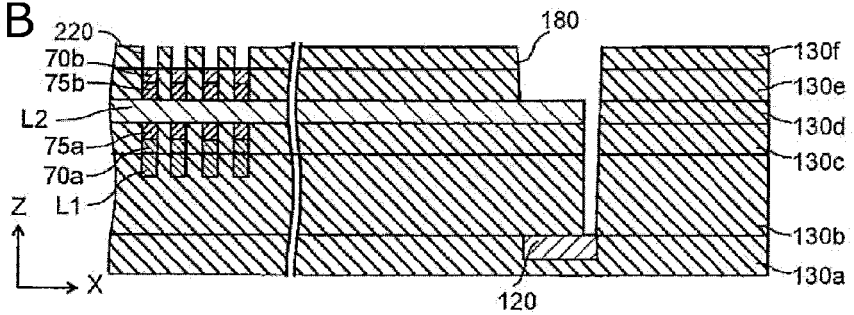

A second embodiment is described with reference to FIGS. 16A and 16B. FIGS. 16A and 16B are schematic sectional views taken along line A-A' in FIG. 4.

The embodiment is equivalent to, in particular, simultaneous formation of the conductive wires L3 and the contact 200 in the first embodiment.

As shown in FIG. 16A, after FIG. 11B, the interlayer insulating film 130f is formed on the interlayer insulating film 130e.

Subsequently, as shown in FIG. 16B, trenches 220 for formation of the conductive wires L3 are formed in the interlayer insulating film 130f by, for example, the RIE method. Further, the contact holes 180 are formed by, for example, the RIE method. The trenches 220 and the contact holes 180 may be simultaneously formed or may be separately formed. The trenches 220 and the contact holes 180 may be formed in any order.

Thereafter, the contact members 110 are formed in the trenches 220 and the contact holes 180. Thereafter, the contact members 110 are planarized by the CMP method to obtain a sectional structure same as the sectional structure shown in FIG. 14A.

The embodiment has an advantage that the planarization by the CMP method is facilitated.

In the CMP method, when the density of polishing target objects increases, in some case, dishing occurs in which a specific pattern or region is polished more than the other portions. This makes the planarization difficult. According to the modification, conductive films, which are polishing target objects, are formed in the trenches 200 and the contact holes 180. That is, the conductive films are disposed respectively in the memory cell region Rm and the conductive wire lead-out region Rp. Consequently, when the CMP is performed, planarization by the CMP method is facilitated compared with when the conductive film is formed only in the memory cell region Rm.

Third Embodiment

Figure 17A:
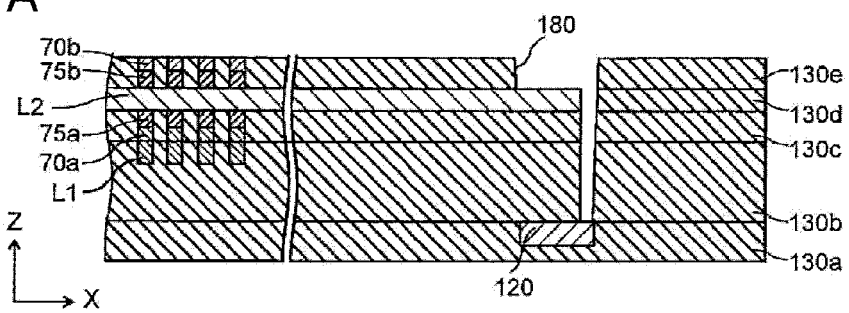
FIGS. 17A and 17B are schematic cross-sectional views showing a manufacturing method of a memory device according to the third embodiment.
Figure 17B:
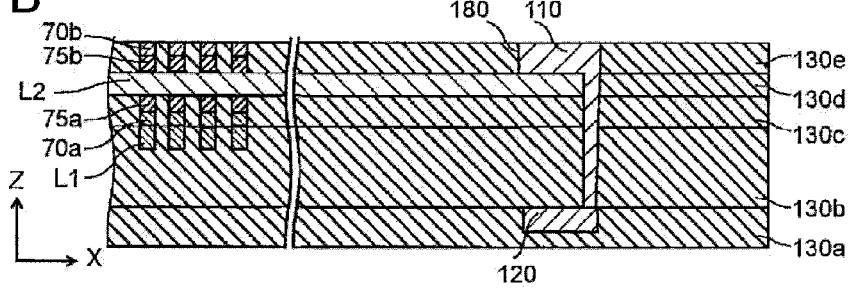

A third embodiment is described with reference to FIGS. 17A and 17B. FIGS. 17A and 17B are schematic sectional views.

The embodiment is equivalent to formation of the contact 200 after the formation of the device selection film 70b in the first embodiment.

The films are formed in the same manner as in the first embodiment up to the planarization by the CMP method shown in FIG. 11B. Thereafter, as shown in FIG. 17A, the contact holes 180 reaching the lower layer interconnects 120 are formed before the interlayer insulating film 130f is formed.

Thereafter, as shown in FIG. 17B, the contact member 110 is formed and planarized by the CMP method. Thereafter, the conductive wires 13 are formed. After the interlayer insulating film 130f is formed, the interlayer insulating film 130f is planarized by the CMP method.

In the embodiment, the etching thickness of the contact holes 180 can be set smaller than the etching thickness in the first embodiment. That is, since processing controllability for the contact holes 180 is improved, it is possible to reduce the contact holes 180. This is effective for refining of the memory cell arrays 10.

Fourth Embodiment

A fourth embodiment is described with reference to FIG. 18.

Figure 18:
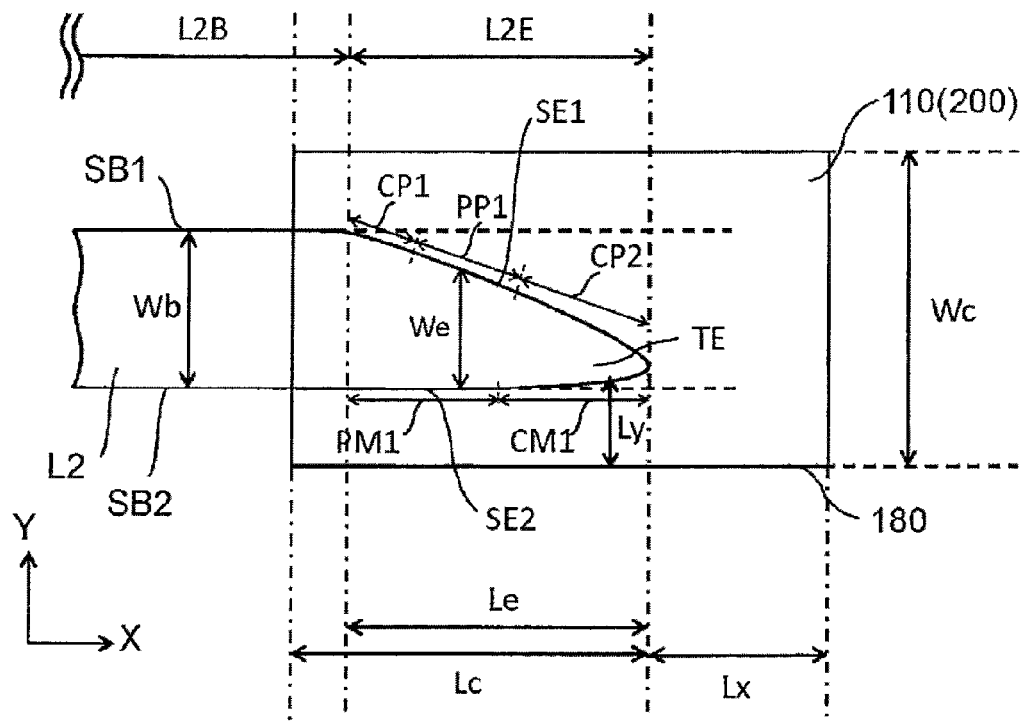
FIG. 18 is a schematic plan view illustrating an end portion of a conductive wire of a memory device to the fourth embodiment.

FIG. 18 is an enlarged view of the end portion of the conductive wire L2. FIG. 18 is a plan view showing the conductive wire L2 and the contact hole 180. The contact member 110 in the contact hole 180 is shown transparent for convenience. The conductive wire L2 is shown without hatching.

In the embodiment, as in the first embodiment, the conductive wire L2 includes the region L2E where the width decreases at the end portion of the conductive wire L2. The conductive wire L2 is connected to the contact 200 in the region L2E.

In the embodiment, a position where the distal end in the X-direction of the region L2E is projected in the Y-direction is formed by one side of the conductive wire L2. That is, the distal end of the region L2E is formed by the side surface SB2 side. A part of the side surface SE2 is formed on a plane substantially the same as the side surface SB2.

The side surface SE1 includes a plurality of surfaces such as the curved surface CP1, the surface PP1, and the curved surface CP2. The side surface SE2 also includes a plurality of surfaces such as the surface PM1 and the curved surface CM1. The side surface SB2 and the surface PM1 are present on substantially the same plane. Consequently, there is an advantage that a memory device can be easily manufactured by a manufacturing method described below.

As the surface PP1 or the surface PM1, a plane may be used.

The contact hole 180 is formed on a part of the upper surface of the conductive wire L2, the side surfaces SE1 and SE2, a part of the side surface SB1, and a part of the side surface SB2. The contact member 110 is provided to be connected to the side surfaces.

In the embodiment, as in the first embodiment, it is possible to improve embedding of the contact member 110. In particular, it is easier to secure the distance Ly on the side surface SE1 side than on the side surface SE2 side. Therefore, the embodiment is used when contact resistance can be sufficiently reduced only by embedding on the side surface SE1 side.

A manufacturing method of the embodiment is, for example, a method described below.

A pattern of the conductive wire L2 is formed in a linear shape. Thereafter, after a mask pattern having angles in both of the X-direction and the Y-direction is formed by the lithography method again, etching is performed by the RIE method or the like. There is an advantage that it is possible to reduce fluctuation in the shape of the distal end due to a lithography process and an etching process.

Fifth Embodiment

A fifth embodiment is described with reference to FIGS. 19 and 20.

Figure 19:
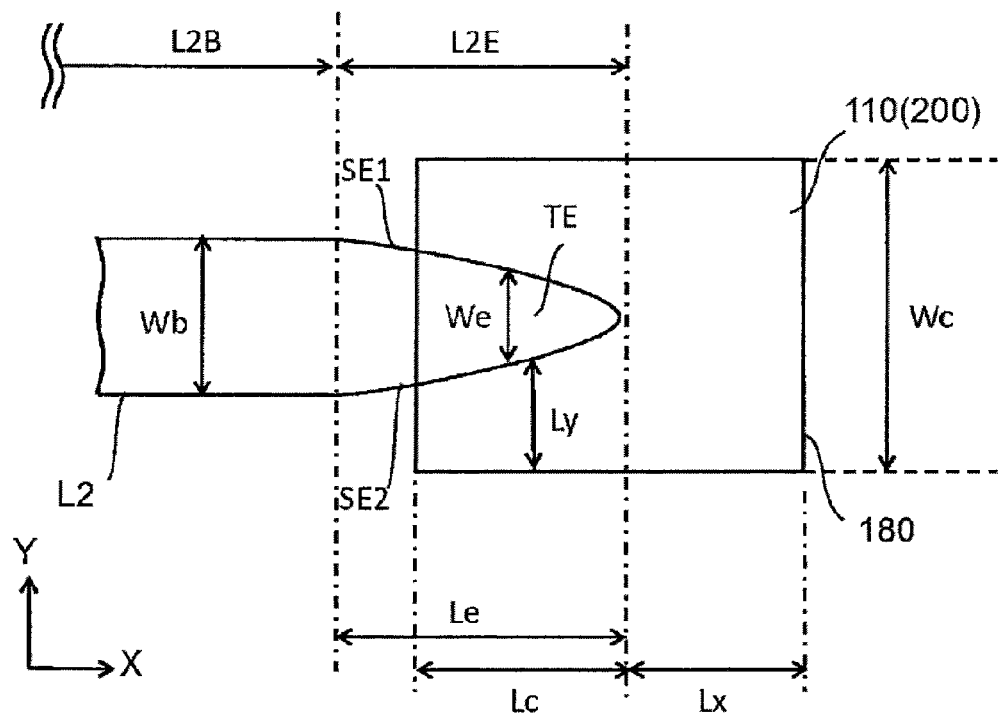
FIG. 19 is a schematic plan view illustrating an end portion of a conductive wire of a memory device to the fifth embodiment.
Figure 20:
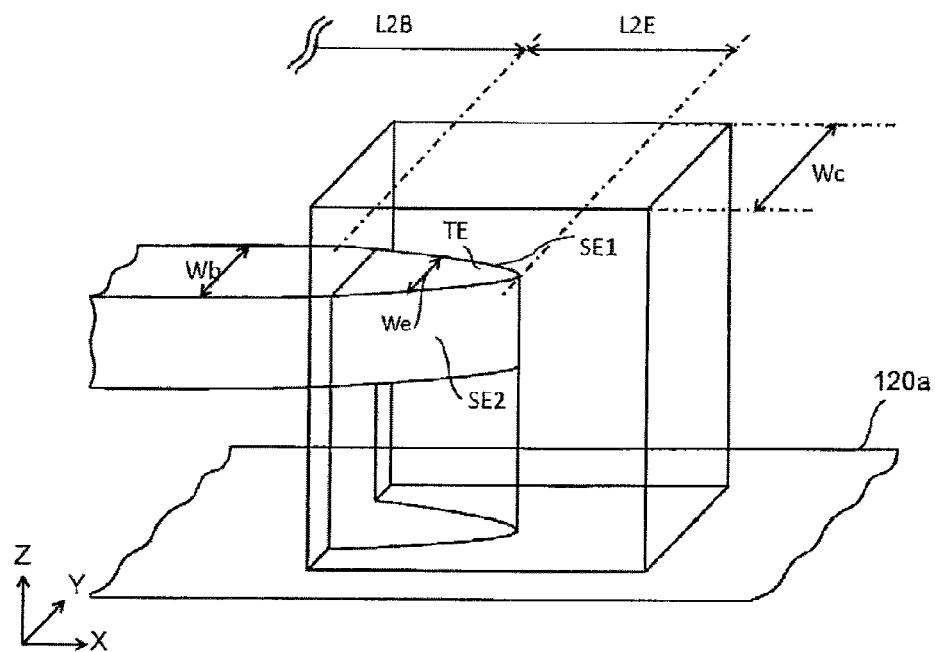
FIG. 20 is a schematic diagrammatic perspective view illustrating the end portion of the conductive wire of the memory device to the first embodiment.

FIGS. 19 and 20 are enlarged views of the end portion of the conductive wire L2. FIG. 19 is a plan view showing the conductive wire L2 and the contact hole 180. The contact member 110 in the contact hole 180 is shown transparent for convenience. The upper surface of the conductive wire L2 is shown without hatching. FIG. 20 is a perspective view showing the conductive wire L2, the contact hole 180, and the upper surface 120a of the lower layer interconnect 120.

In the embodiment, as in the embodiments described above, the conductive wire L2 includes the region L2E where the width decreases in the end portion of the conductive wire L2. The conductive wire L2 is connected to the contact 200 in the region L2E.

The contact 200 is formed in contact with the region L2E and not in contact with the region L2B.

In this case, it is possible to obtain an effect of embedding property improvement in the entire region where the contact 200 is formed.

In this way, when the contact 200 is in contact with only a part of the region L2E, the length Lc in the X-direction in which the contact member 110 is in contact with the conductive wire L2 is also desirably twice or more as large as the width Wb.

Sixth Embodiment

A sixth embodiment is described with reference to FIGS. 21 and 22.

Figure 21:
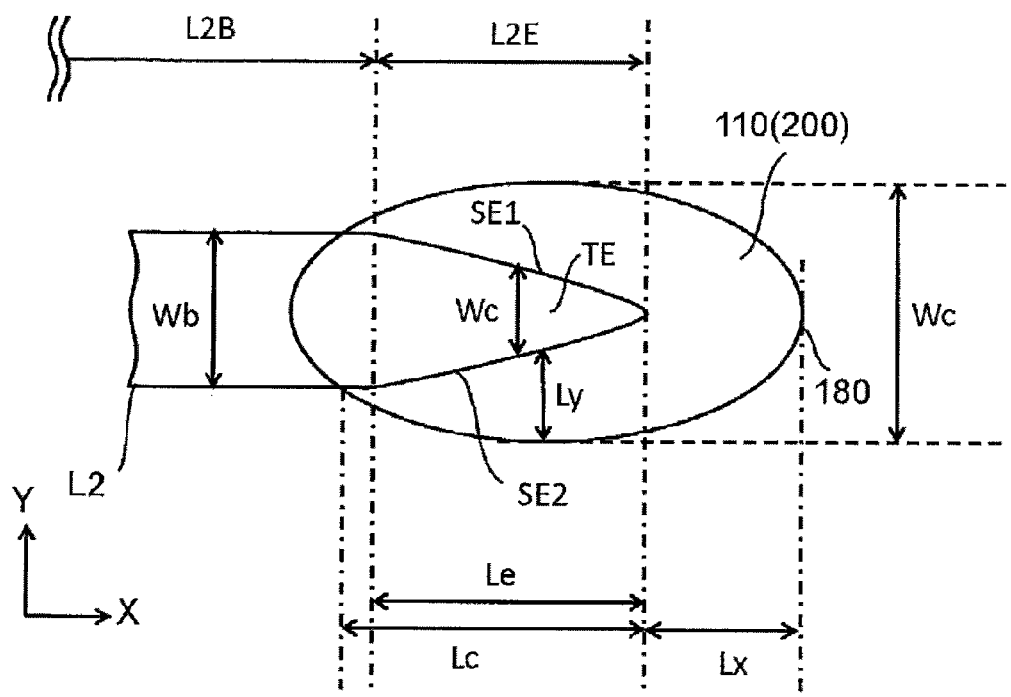
FIG. 21 is a schematic plan view illustrating an end portion of a conductive wire of a memory device to the sixth embodiment.
Figure 22:
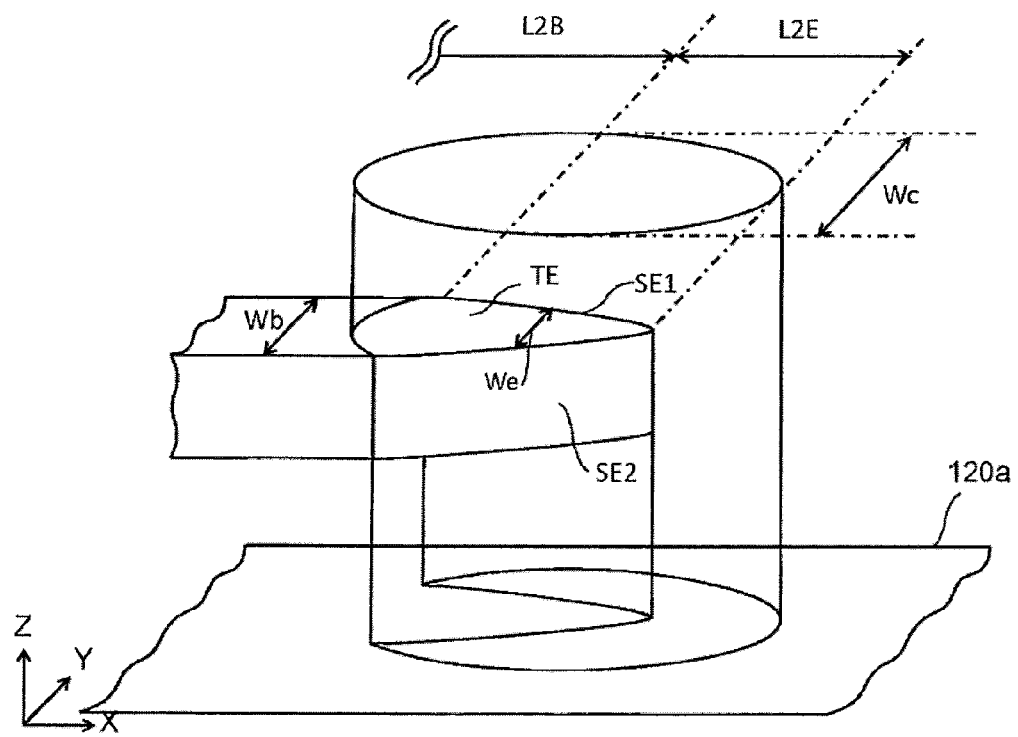
FIG. 22 is a schematic diagrammatic perspective view illustrating the end portion of the conductive wire of the memory device to the sixth embodiment.

FIGS. 21 and 22 are enlarged views of the end portion of the conductive wire L2. FIG. 21 is a plan view showing the conductive wire L2 and the contact hole 180. The contact member 110 in the contact hole 180 is shown as transparent for convenience. The upper surface of the conductive wire L2 is shown without hatching. FIG. 22 is a perspective view showing the conductive wire L2, the contact 200, and the upper surface 120a of the lower layer interconnect 120.

In the embodiment, unlike the first embodiment, the contact hole 180 is formed in a substantially oval shape or a substantially elliptical shape. In the embodiment, effects same as the effects in the first embodiment can be obtained. Note that, in order to reduce the contact resistance of the contact 200 and the conductive wire L2, it is desired to increase the contact area. That is, the contact hole 180 is desirably formed in a substantially oval shape or a substantially elliptical shape longer in the X-direction than in the Y-direction. Ideally, the length in the X-direction is desirably twice or more as large as the length in the Y-direction.

Note that, as in the other embodiments, the length Lc is desirably twice or more as large as the width Wb.

Seventh Embodiment

A seventh embodiment is described with reference to FIGS. 23 and 24.

Figure 23:
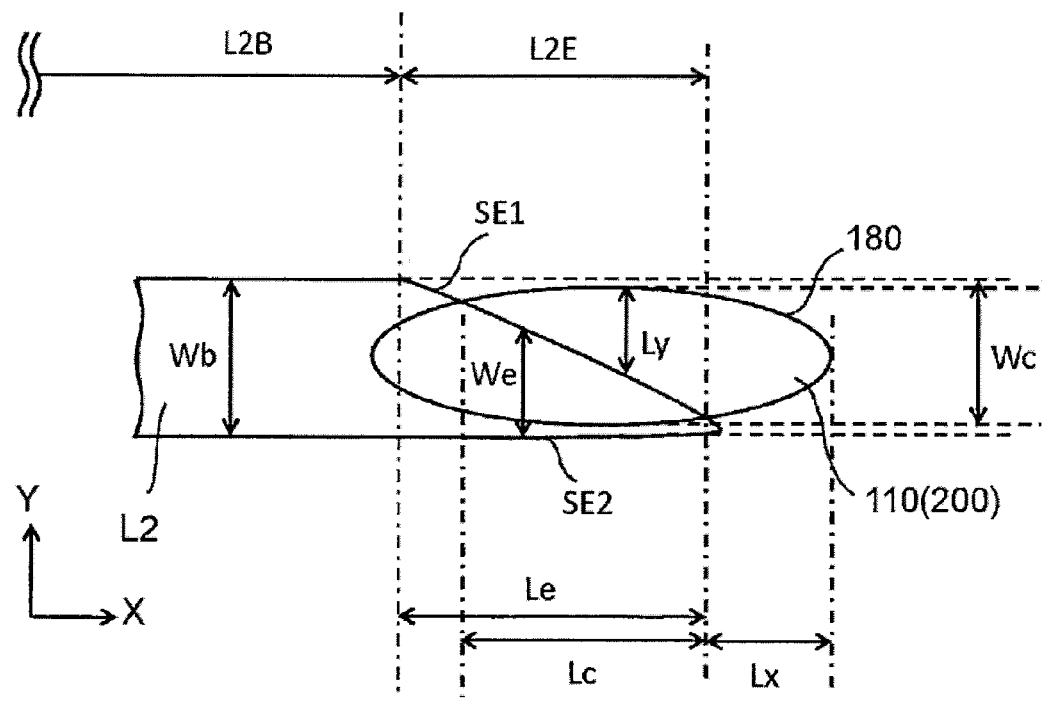
FIG. 23 is a schematic plan view illustrating an end portion of a conductive wire of a memory device to the seventh embodiment.
Figure 24:
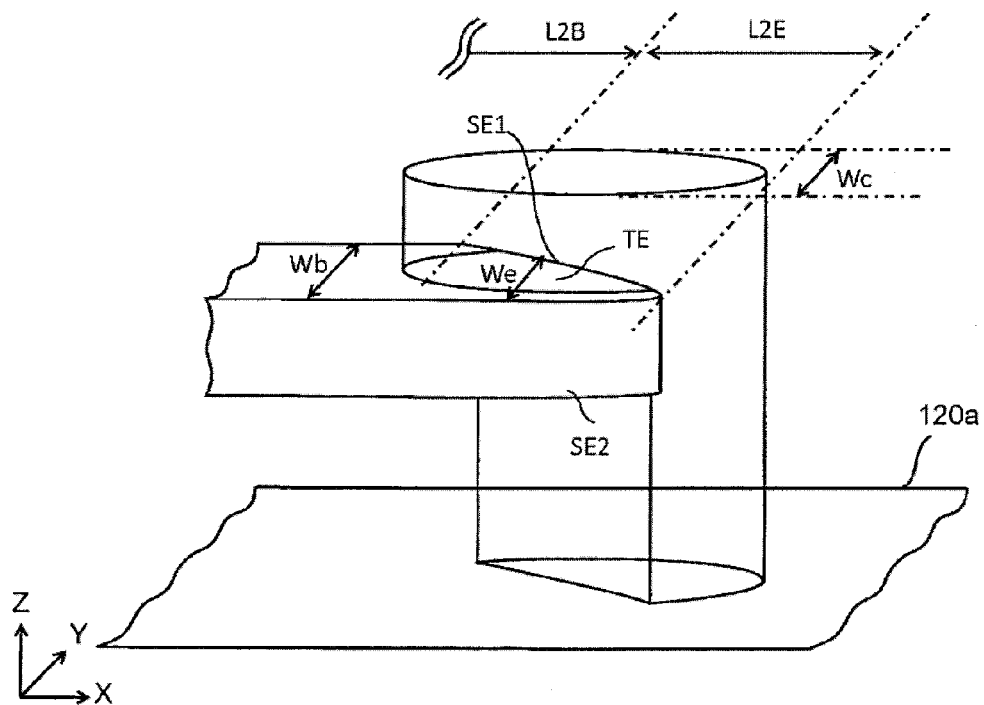
FIG. 24 is a schematic diagrammatic perspective view illustrating the end portion of the conductive wire of the memory device to the seventh embodiment.

FIGS. 23 and 24 are enlarged views of the end portion of the conductive wire L2. FIG. 23 is a plan view showing the conductive wire L2 and the contact hole 180. The contact member 110 in the contact hole 180 is shown transparent for convenience. The upper surface of the conductive wire L2 is shown without hatching. FIG. 24 is a perspective view showing a conductive wire L2, the contact hole 180, and the upper surface 120*a* of the lower layer interconnect 120.

In the embodiment, as in the embodiments described above, the conductive wire L2 includes the region L2E where the width decreases the Y-direction. The region L2E is formed in a substantially triangular prism shape. The side surface SE2 is formed on a plane substantially the same as the side surface SB2.

The contact hole 180 is formed in a substantially oval shape or a substantially elliptical shape. The contact member 110 provided in the contact hole 180 is provided in contact with a part of the upper surface of the conductive wire L2, a part of the side surface SE1, and a part of the side surface SB1. In the embodiment, the contact member 110 is not provided in contact with the side surface SE2.

Since embedding of the contact member 110 is unnecessary on the side surface SE2 side, it is possible to further reduce the width Wc in the Y-direction of the contact 200 than in the first embodiment.

The width Wc in the Y-direction of the contact 200 is smaller than the width Wb in the Y-direction of the conductive wire L2. Further, a region where the contact 200 is projected on the Y-axis is included in a region where the conductive wire L2 is projected on the Y-axis.

Consequently, it is possible to further reduce a pitch between the conductive wires L2 irrespective of the contact 200. It is possible to provide a memory device having higher density.

Eighth Embodiment

An eighth embodiment is described with reference to FIGS. 25 and 26.

Figure 25:
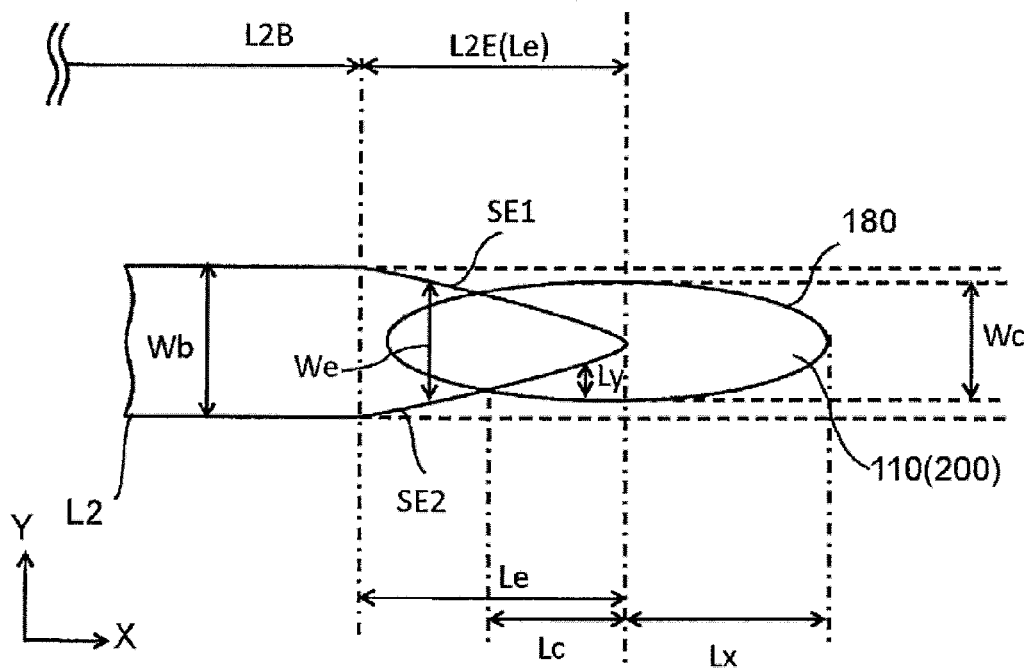
FIG. 25 is a schematic plan view illustrating an end portion of a conductive wire of a memory device to the eighth embodiment.
Figure 26:
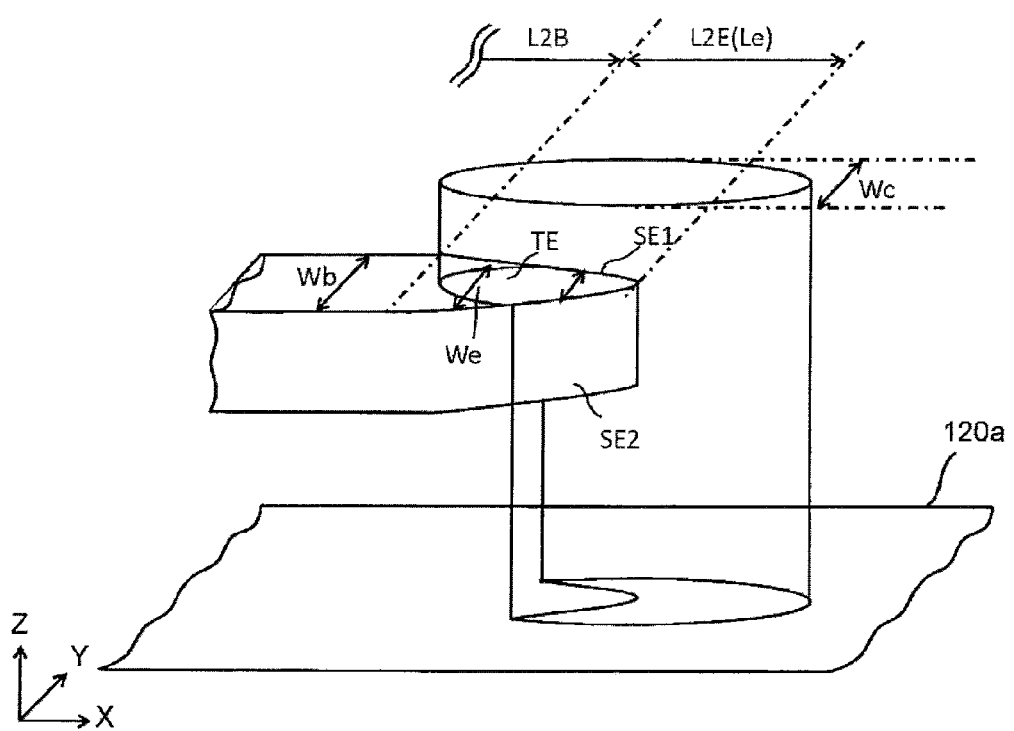
FIG. 26 is a schematic diagrammatic perspective view illustrating the end portion of the conductive wire of the memory device to the eighth embodiment.

FIGS. 25 and 26 are enlarged views of the end portion of the conductive wire L2. FIG. 25 is a plan view showing the conductive wire L2 and the contact hole 180. The contact member 110 in the contact hole 180 is shown transparent for convenience. The upper surface of the conductive wire L2 is shown without hatching. FIG. 26 is a perspective view showing the conductive wire L2, the contact hole 180, and the upper surface 120*a* of the lower layer interconnect 120.

In the embodiment, as in the embodiments described above, the conductive wire L2 includes the region L2E where the width decreases the Y-direction.

The contact hole 180 is formed in a substantially oval shape or a substantially elliptical shape. The contact member 110 in the contact hole 180 is provided in contact with the region L2E and provided in contact with the side surface SE1 and the side surface SE2.

As in the seventh embodiment, the width Wc in the Y-direction of the contact 200 is smaller than the width Wb in the Y-direction of the conductive wire L2. Further, a region where the contact 200 is projected on the Y-axis is included in a region where the conductive wire L2 is projected on the Y-axis.

Therefore, it is possible to further reduce the pitch between the conductive wires L2.

The embodiment can be used when the embedding property of the contact member 110 is sufficiently high. Since the contact member 110 is in contact with the side surfaces SE1 and SE2, as described above, it is possible to reduce the pitch between the conductive wires L2 while sufficiently reducing the resistance of the contact 200.

Several embodiments of the invention are described above. However, the embodiments are presented as examples and are not intended to limit the scope of the invention. The new embodiments can be carried out in other various forms. Various kinds of omission, substitution, and changes can be performed without departing from the spirit of the invention. The embodiments and the modifications of the embodiments are included in the scope and the gist of the invention and included in the inventions described in claims and a scope of equivalents of the inventions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A memory device comprising:
    a substrate;
    a conductive wire provided above the substrate to extend in a first direction and including an end portion decreases in width toward a distal end; and
    a contact connected to the conductive wire at least a side surface of the end portion,
    the end portion including, in the contact, a first portion having a shortest distance from an outer peripheral surface of the contact and a second portion extending from the first portion and having a distance from the outer peripheral surface of the contact longer than the shortest distance.

2. The device according to claim 1, wherein the end portion has needle-like form.

3. The device according to claim 1, wherein the end portion is formed into needle-like form having an acute angle.

4. The device according to claim 1, wherein the second portion of the conductive wire is provided to overlap a center point of the contact when viewed from above.

5. The device according to claim 1, wherein length in the first direction of the second portion is larger than a half of length in the first direction of the contact.

6. The device according to claim 1, wherein width in a second direction orthogonal to the first direction of the contact is smaller than width in the second direction of the first portion.

7. The device according to claim 1, wherein length in the first direction of the second portion is larger than length in a second direction orthogonal to the first direction of the first portion.

8. The device according to claim 1, further comprising a memory cell provided above the substrate, wherein
the conductive wire is directly or indirectly connected to the memory cell on one side and includes the end portion on the other side.

9. The device according to claim 1, wherein a distance from an outer peripheral surface of the contact of the second portion is longer than the shortest distance over an entire side surface of the second portion.

10. The device according to claim 1, wherein a boundary of a region of the contact in contacting with the conductive wire exists on a side surface of the end portion.

11. A memory device comprising:
a substrate;
a plurality of first conductive wires provided on the substrate and extending in a first direction;
a plurality of second conductive wires provided on the first conductive wires and extending in a second direction crossing the first direction;
a memory cell connected between a singularity of the first conductive wire and a singularity of the second conductive wire;
a first contact connected to at least a part of an upper surface of an end portion of the first conductive wire and at least a part of a side surface of the end portion; and
a second contact connected to an upper surface of an end portion of the second conductive wire and at least a part of a side surface of the end portion of the second conductive wire,
the end portion of the first conductive wire including a first portion having substantially same width in the second direction and a second portion extending from the first portion and having width in the second direction decreasing toward a distal end of the end portion of the first conductive wire, and
the end portion of the second conductive wire including a third portion having substantially same width in the first direction and a fourth portion extending from the third portion and having width in the first direction decreasing toward a distal end of the end portion of the second conductive wire.

12. The device according to claim 11, wherein the end portion of the first conductive wire and the end portion of the second conductive wire have needle-like form.

13. The device according to claim 11, wherein the end portion of the first conductive wire and the end portion of the second conductive wire are formed into needle-like form having an acute angle.

14. The device according to claim 11, wherein the second portion is provided to overlap a center point of the first contact when viewed from above, and
the fourth portion is provided to overlap a center point of the second contact when viewed from above.

15. The device according to claim 11, wherein length in the first direction of the second portion in contact with the first contact is larger than a half of length in the first direction of the first contact, and
length in the second direction of the fourth portion in contact with the second contact is larger than a half of length in the first direction of the second contact.

16. The device according to claim 11, wherein width in the second direction of the first contact is smaller than width in the second direction of the first portion, and
width in the first direction of the second contact is smaller than width in the first direction of the third portion.

17. The device according to claim 11, wherein length in the first direction of the second portion in contact with the first contact is larger than length in the second direction of the first portion, and
length in the second direction of the fourth portion in contact with the second contact is larger than length in the first direction of the third portion.

18. The device according to claim 11, wherein the first contact is not in contact with the first portion, and
the second contact is not in contact with the third portion.

19. The device according to claim 11, wherein the memory cell includes a variable resistance film.

* * * * *